United States Patent [19]

Pan

[11] Patent Number: 5,764,175
[45] Date of Patent: Jun. 9, 1998

[54] DUAL RESOLUTION CIRCUITRY FOR AN ANALOG-TO-DIGITAL CONVERTER

[75] Inventor: Fwurong Marco Pan, Saratoga, Calif.

[73] Assignee: Linear Technology Corporation, Milpitas, Calif.

[21] Appl. No.: 717,774

[22] Filed: Sep. 24, 1996

[51] Int. Cl.[6] ................................................ H03M 1/38
[52] U.S. Cl. .......................... 341/161; 341/156; 327/52
[58] Field of Search ............................ 341/133, 134, 341/135, 136, 158, 161, 162, 163, 155; 327/52, 65, 434, 563; 330/298, 254

[56] References Cited

U.S. PATENT DOCUMENTS

| | | | |
|---|---|---|---|
| 3,840,756 | 10/1974 | Jones | 330/254 |
| 4,459,555 | 7/1984 | Jett, Jr. | 330/253 |
| 4,851,838 | 7/1989 | Shier | 341/121 |
| 4,893,091 | 1/1990 | Lillis et al. | 330/253 |
| 4,962,323 | 10/1990 | Ta | 307/350 |
| 5,006,853 | 4/1991 | Kiriaki et al. | 341/156 |
| 5,047,665 | 9/1991 | Burt | 307/355 |
| 5,272,481 | 12/1993 | Sauer | 341/165 |
| 5,352,937 | 10/1994 | Dingwall | 307/355 |
| 5,541,538 | 7/1996 | Bacrania et al. | 327/77 |
| 5,612,648 | 3/1997 | McClellan et al. | 330/253 |
| 5,661,684 | 8/1997 | Wong et al. | 327/52 |

OTHER PUBLICATIONS

"A 5V, 16b 10μs Differential CMOS ADC," Khen-Sang Tan et al., Digest of Technical Papers 1990 IEEE International Solid-State Circuits Conference (1990).

Primary Examiner—Jeffrey A. Gaffin
Assistant Examiner—Kim Huynh
Attorney, Agent, or Firm—Fish & Neave; G. Victor Treyz

[57] ABSTRACT

Circuitry is provided for use in a successive approximation analog-to-digital converter that protects the transistors in a high-resolution input stage from voltage threshold changes due to exposure to large input signals, while allowing a low-resolution input stage to process the large input signals. An input protection transistor allows the high-resolution input stage to be placed in either a differential amplifier configuration or a source follower pair configuration. An input circuit is also provided for a successive approximation analog-to-digital converter having high-resolution and low-resolution input stage circuitry. Protection circuitry within the input circuit ensures that the high-resolution input stage circuitry is not adversely affected by exposure to large input signals.

48 Claims, 12 Drawing Sheets

DUAL RESOLUTION CIRCUITRY FOR AN ANALOG-TO-DIGITAL CONVERTER

BACKGROUND OF THE INVENTION

This invention relates to analog-to-digital converters, and more particularly, to improved circuitry for input stages in successive approximation analog-to-digital converters.

The input stages of many modern analog-to-digital converters contain metal-oxide-semiconductor (MOS) transistors. Input stages constructed from MOS transistors have desirable properties, such as large input impedances, and can be highly accurate under a variety of operating conditions. However, MOS transistor input stages can be adversely affected when exposed to large input signals. For example, substantial changes in the voltage thresholds of MOS transistors can occur if the transistors are exposed to large gate-source voltages. It is believed that this voltage threshold hysteresis effect results from charge-trapping in the vicinity of an MOS transistor gate.

Substantial changes in the voltage thresholds of transistors in the input stage of an analog-to-digital converter are generally unacceptable, because they decrease the accuracy of the analog signal processing performed by the analog-to-digital converter. Moreover, voltage threshold hysteresis induced by exposure to large input signals can be particularly detrimental to the performance of analog-to-digital converters, because the time periods over which voltage thresholds are altered are comparable to the time periods of interest in the analog-to-digital conversion process.

To overcome the problems associated with voltage threshold shifts, analog-to-digital converters have been developed that attempt to shield the high-accuracy portion of their input circuitry from exposure to large input voltages. The shielded circuitry is used at a later time for high-accuracy measurements. While shielding the high-accuracy circuitry, less critical circuitry is used to handle the large input voltages. This approach has been used in analog-to-digital converters of the successive approximation type.

Successive approximation analog-to-digital converters contain comparator circuitry for analyzing the voltage difference between input signals and internally-generated trial voltages. In some successive approximation analog-to-digital converters, one channel of comparator circuitry is used to handle large voltages and another channel is used for smaller voltages. These circuits have a dummy input stage through which current is shunted when it is desired to protect the primary input stage. When one channel is in use, the input stage of the other channel is protected by removing the bias current from the input stage of the channel with the dummy input stage. However, circuits using dummy input stages have numerous components and are relatively complex. In addition, although removing the bias current is thought to reduce the likelihood of damage, input stage transistor gates continue to be exposed to potentially damaging large voltages. Switching on and off the bias current to the input stage using a dummy circuit may also be undesirable in situations in which there are start up or warm up transients after the current is switched on.

In view of the foregoing, it would be desirable to be able to provide improved circuitry for protecting a portion of the input circuitry in an analog-to-digital converter from large input signals.

It would also be desirable to be able to provide an improved input circuit for a successive approximation analog-to-digital converter having two channels of comparator circuitry.

SUMMARY OF THE INVENTION

It is therefore an object of the present invention to provide improved circuitry for protecting a portion of the input circuitry in an analog-to-digital converter from large input signals.

It is also an object of the present invention to provide an improved input circuit for a successive approximation analog-to-digital converter having two channels of comparator circuitry.

In accordance with the principles of the present invention, input protection circuitry is provided that protects a high-resolution input stage of a successive approximation analog-to-digital converter from large input signals without using a dummy-pair circuit. In one embodiment of the invention, an input protection transistor is provided that places the high-resolution input stage in either a high-accuracy differential amplifier configuration or a source follower pair configuration. A low-resolution input stage is used to process large input signals.

When it is desired to protect the transistors in the high-resolution input stage from exposure to large input signals, the input protection transistor is turned off. With the input protection transistor turned off, the high-resolution input stage forms a source follower pair in saturation. The source follower configuration ensures that the gates of the MOS transistors in the high-resolution input stage are not exposed to large gate-source voltages, which could result in voltage threshold shifts. When it is desired to measure low magnitude signals with high accuracy, the input protection transistor is turned on, which places the high-resolution input stage in a differential amplifier configuration, suitable for high-accuracy measurements.

In addition, an input circuit with a differential input is provided that contains high-resolution circuitry for providing a high-resolution output and low-resolution circuitry for providing a low-resolution output. Protection circuitry within the input circuit ensures that the high-resolution circuitry is not damaged during exposure of the input circuit to large input signals. The input circuit is used by both high-resolution comparator circuitry and low-resolution comparator circuitry, which eliminates duplicative circuitry in the input stages of successive approximation analog-to-digital converters.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

3

Figure 6:
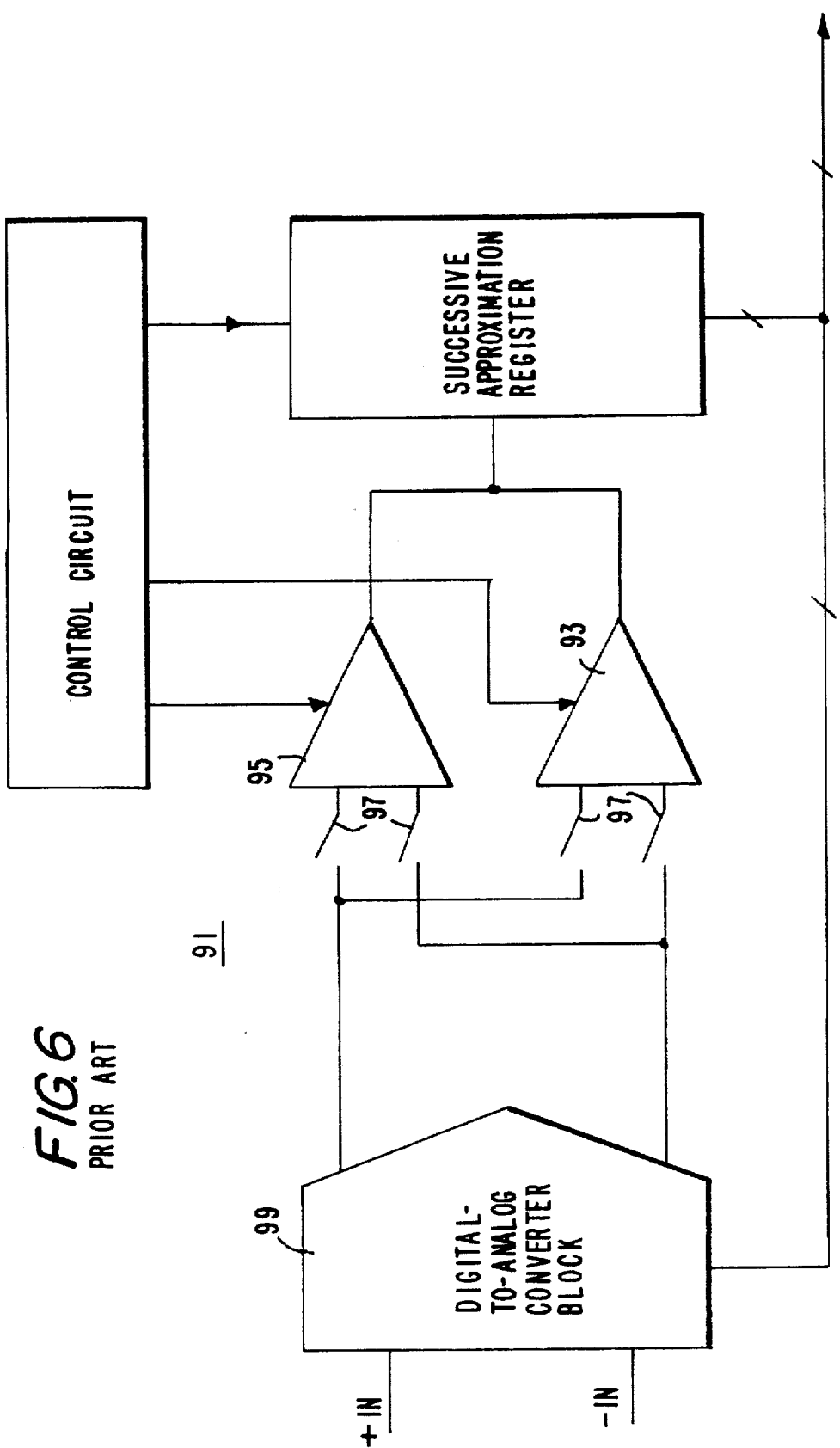
Figure 7:
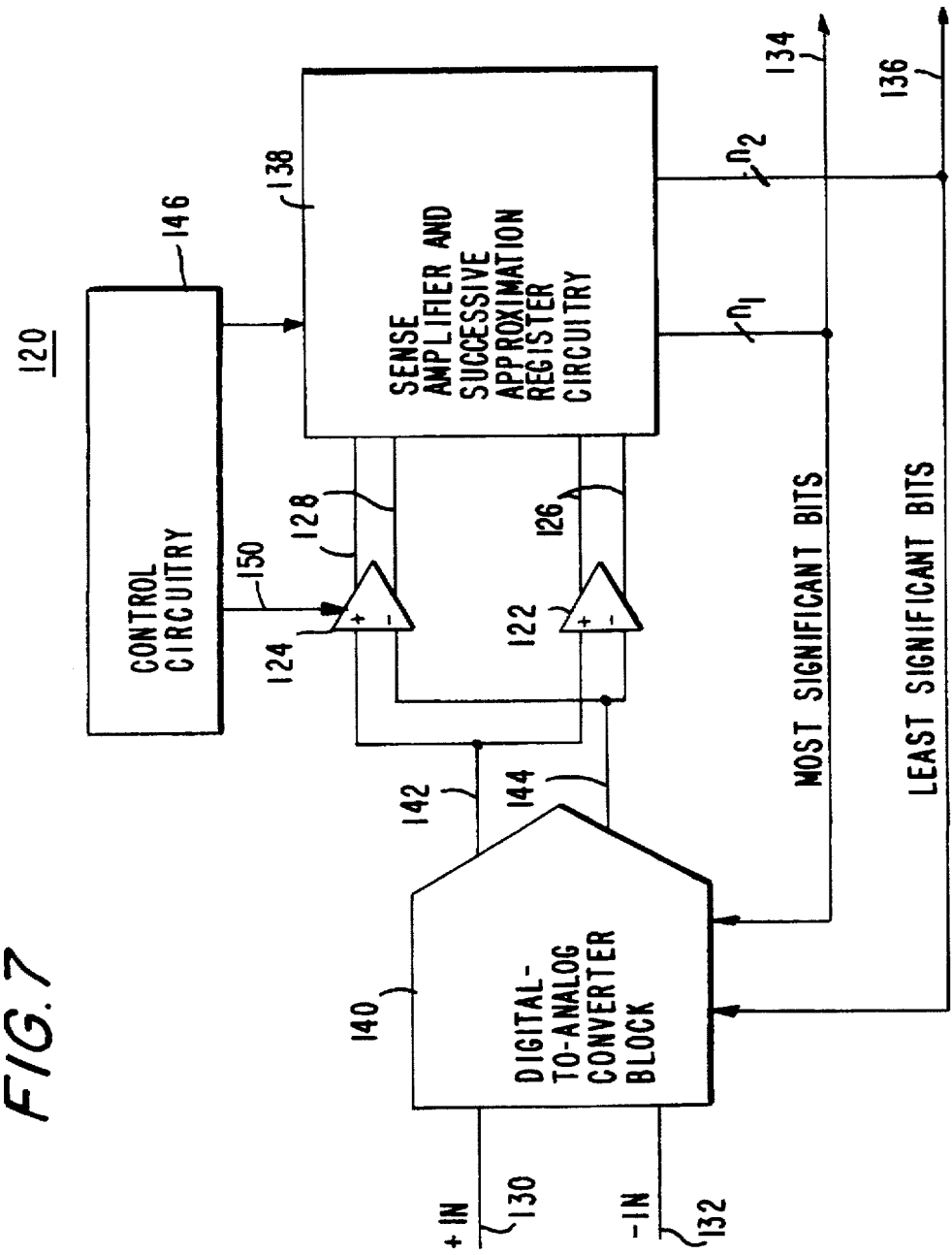
Figure 8:
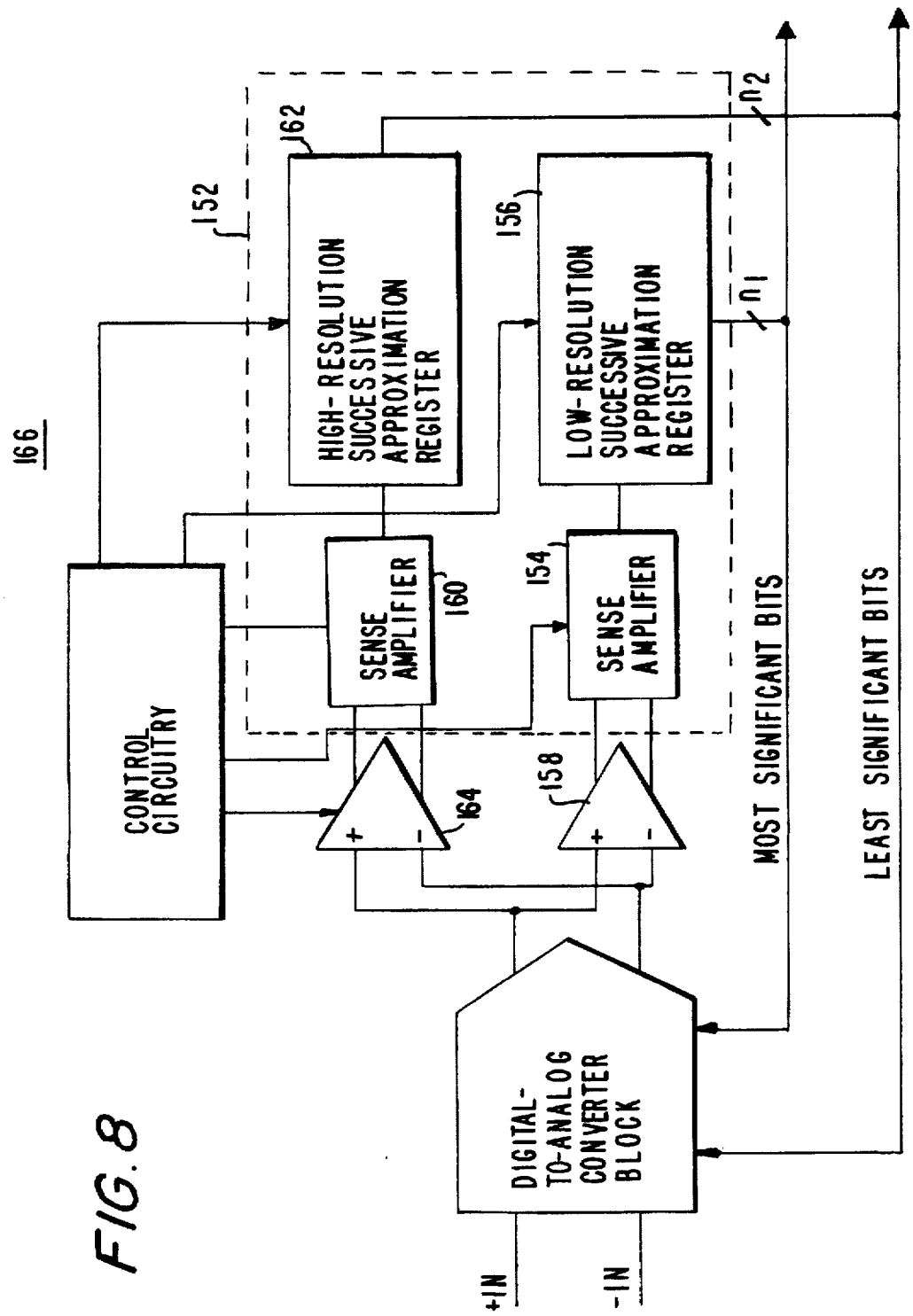
Figure 9:
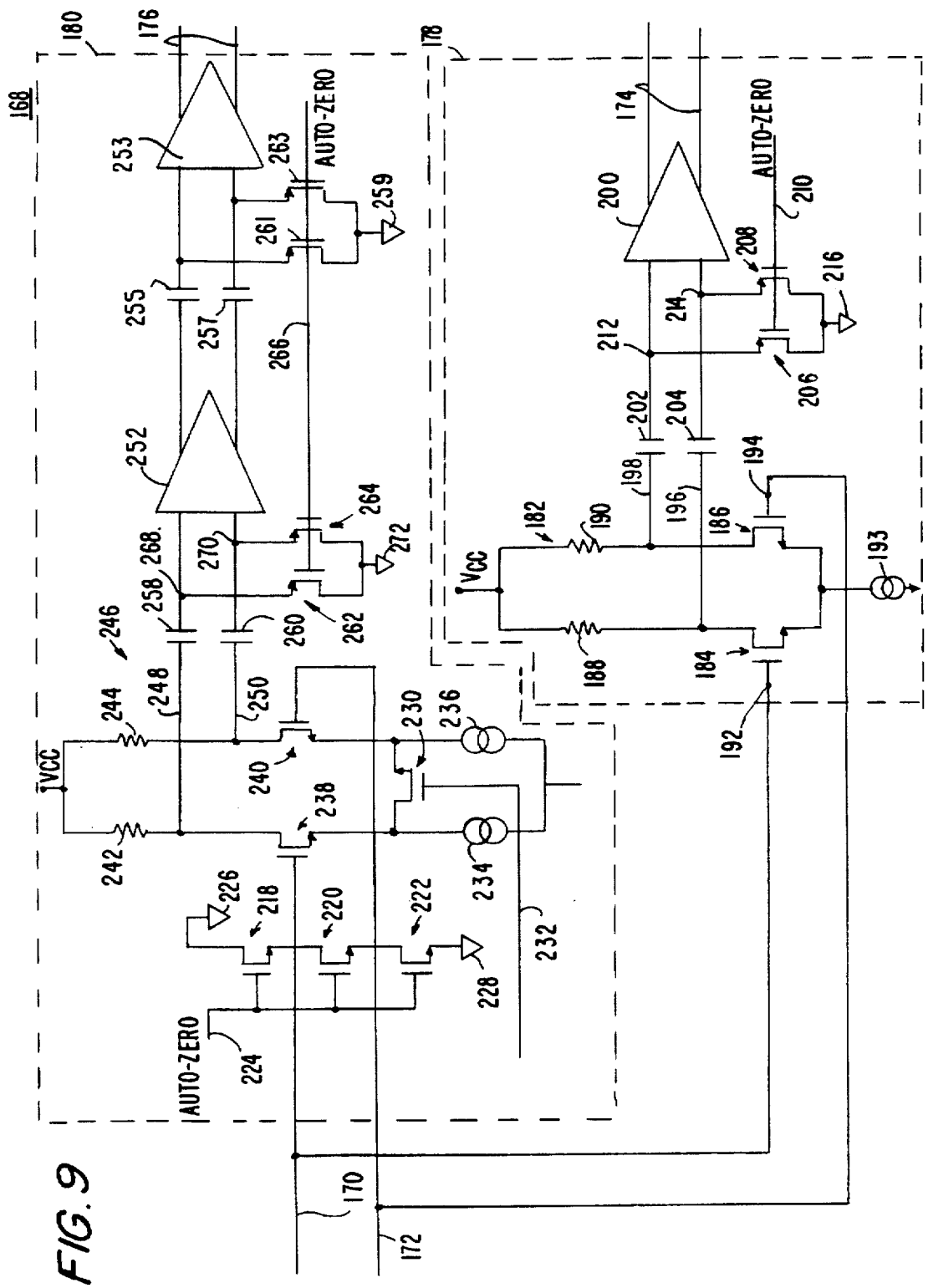
Figure 10:
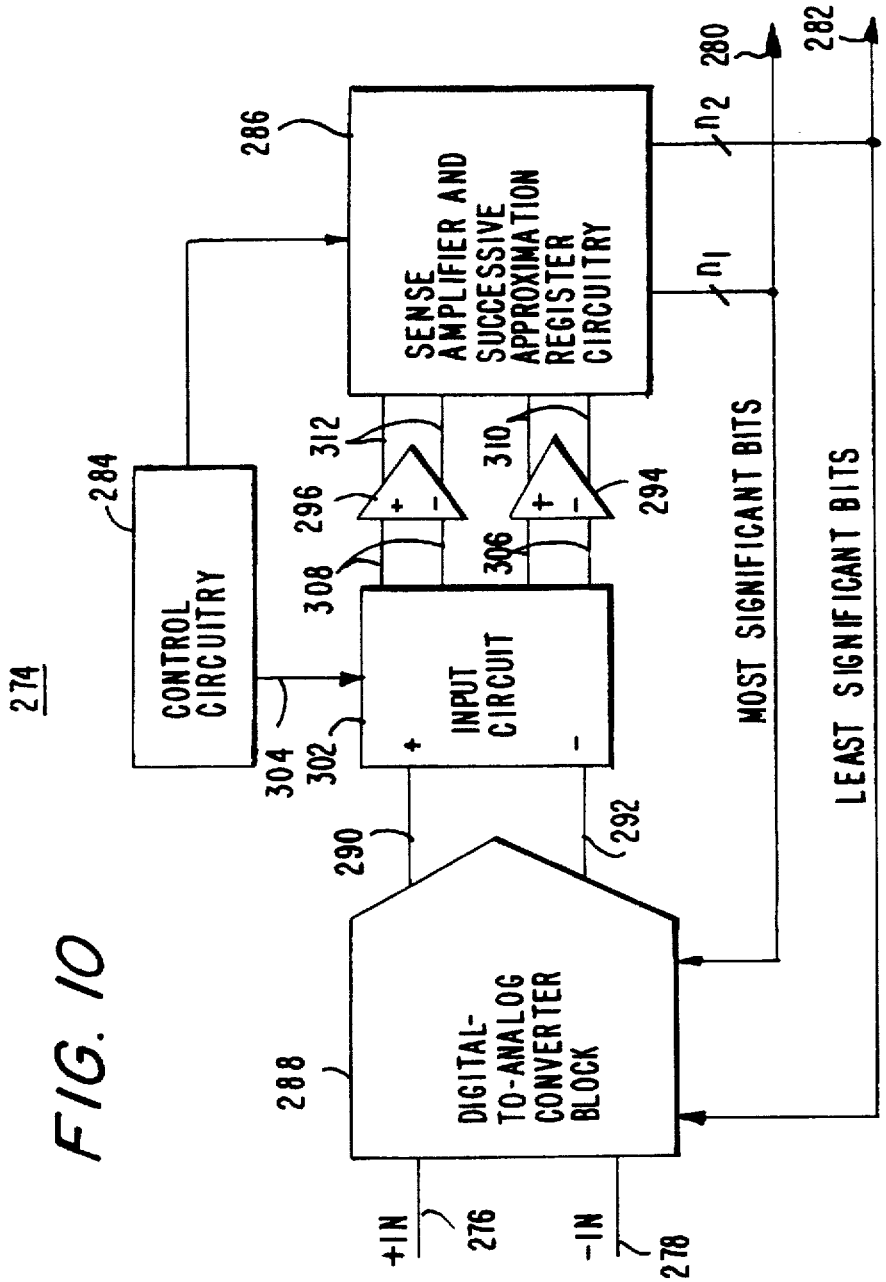
Figure 11:
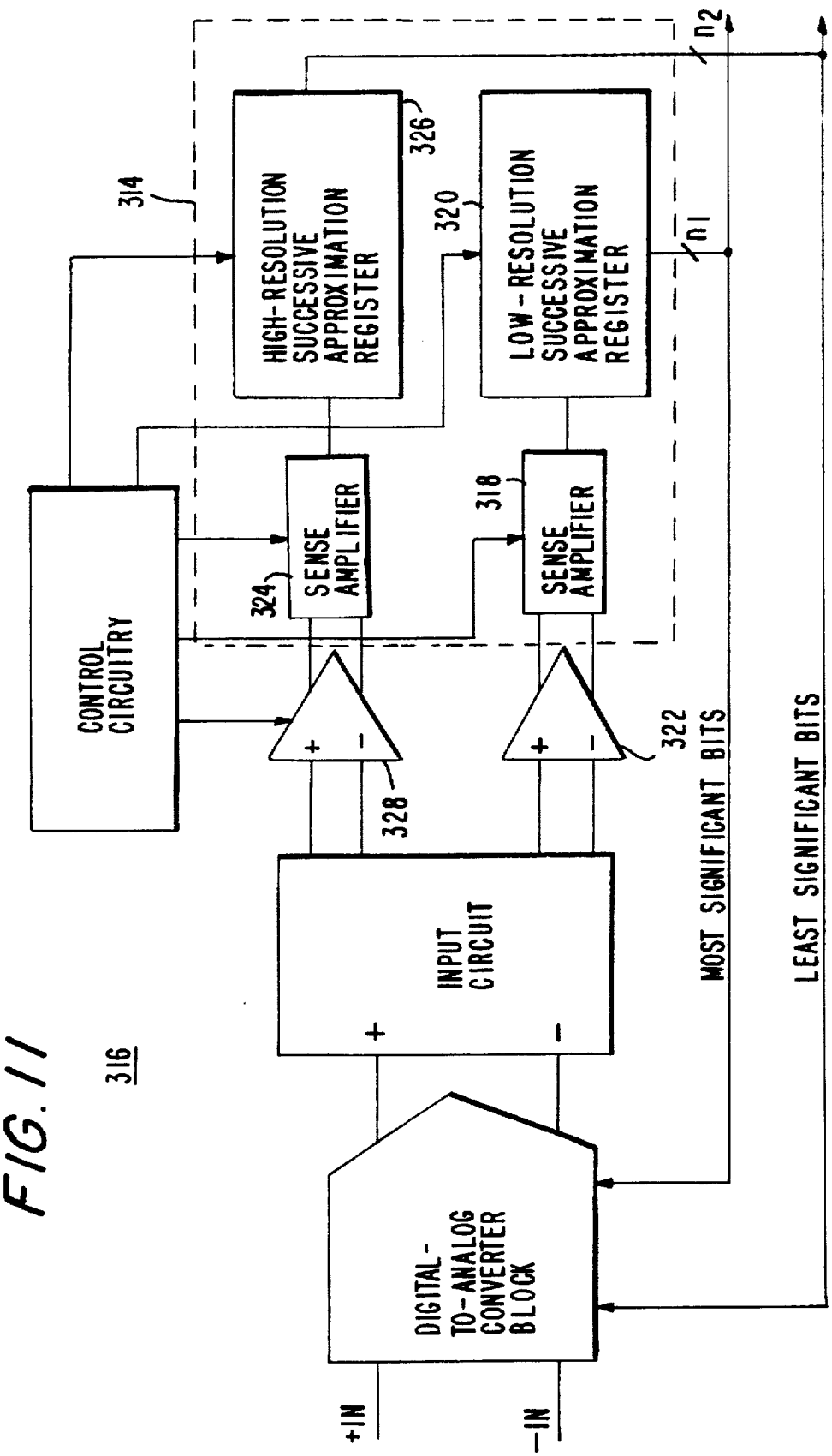
Figure 12:
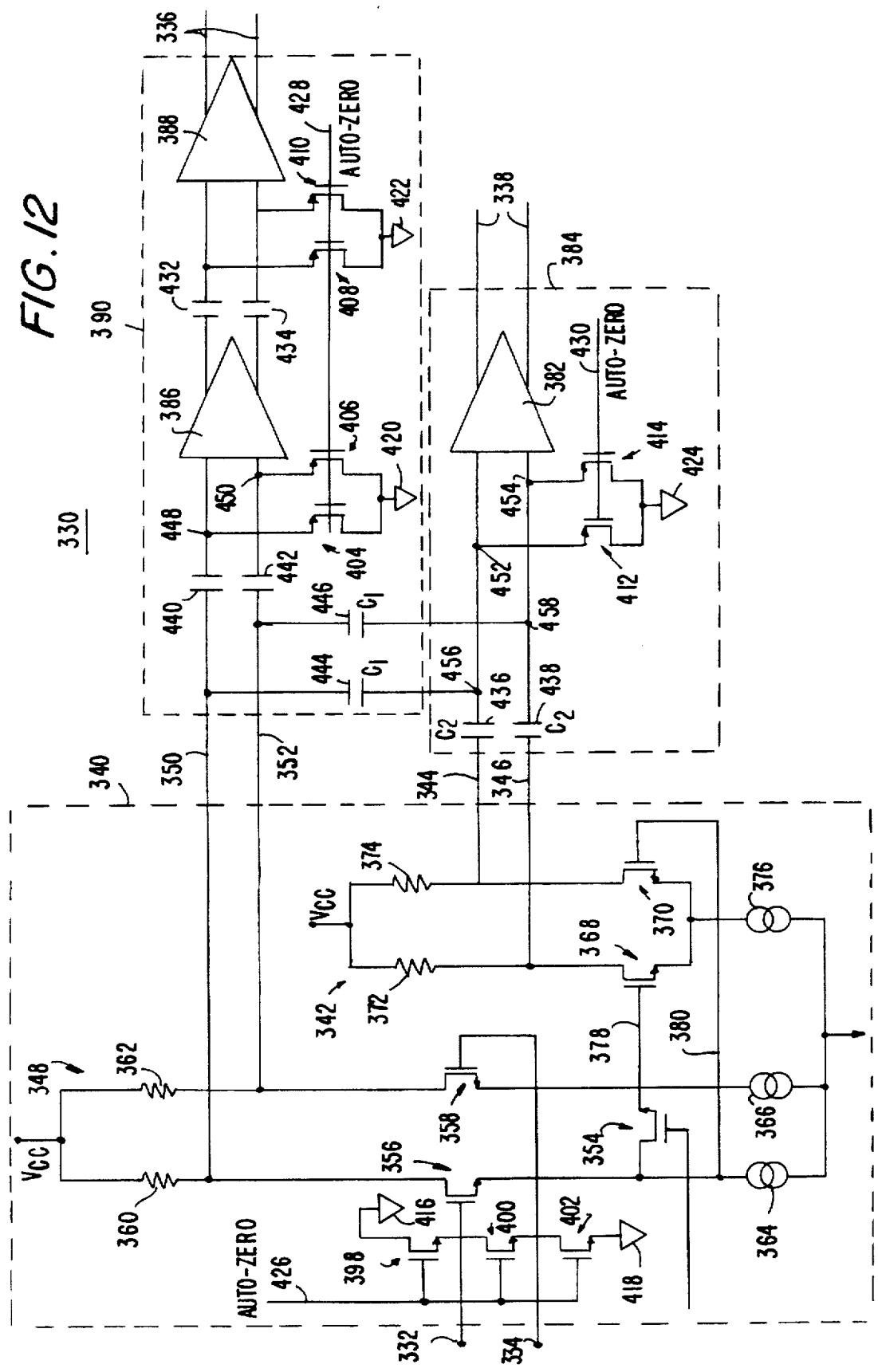

FIG. 6 is a circuit diagram illustrating another method for protecting the input stage of a successive approximation analog-to-digital converter;

FIG. 7 is a circuit diagram of a successive approximation analog-to-digital converter in accordance with the principles of the present invention;

FIG. 8 is a circuit diagram of a successive approximation analog-to-digital converter having two successive approximation registers in accordance with the principles of the present invention;

FIG. 9 is a circuit diagram of comparator circuitry suitable for use in the analog-to-digital converters of FIGS. 7 and 8 in accordance with the principles of the present invention;

FIG. 10 is a circuit diagram of a successive approximation analog-to-digital converter having an input circuit in accordance with the principles of the present invention;

FIG. 11 is a circuit diagram of a successive approximation analog-to-digital converter having an input circuit and two successive approximation registers in accordance with the principles of the present invention; and FIG. 12 is a circuit diagram of comparator circuitry suitable for use in the analog-to-digital converters of FIGS. 10 and 11 in accordance with the principles of the present invention.

DETAILED DESCRIPTION OF THE INVENTION

Figure 1:
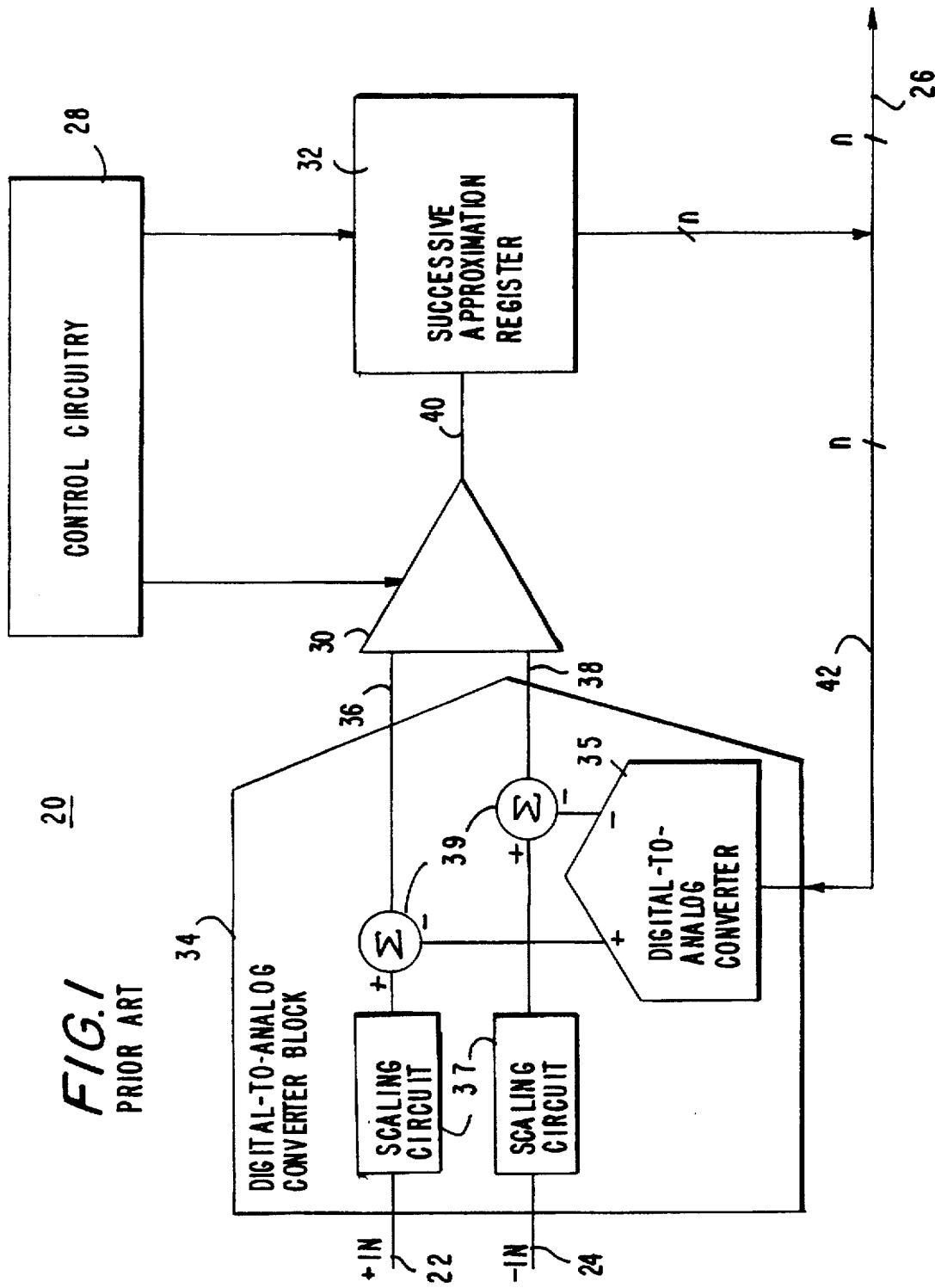
FIG. 1 is a circuit diagram of a conventional successive approximation analog-to-digital converter.

A conventional successive approximation analog-to-digital converter 20 is shown in FIG. 1. Analog-to-digital converter 20 receives an analog input voltage across input terminals 22 and 24 and provides a corresponding digital output signal at output 26. Analog-to-digital converter 20 digitizes the input voltage across input terminals 22 and 24 by making successive digital approximations of the analog input voltage using a binary search pattern.

Control circuitry 28 enables comparator 30 and directs successive approximation register 32 to generate a series of digital codes, which are provided to digital-to-analog converter block 34 via bus 42. Digital-to-analog converter block 34 contains digital-to-analog converter 35, which generates trial voltages based on the digital codes. The input voltages across terminals 22 and 24 are scaled using scaling circuits 37. The difference between the voltage across the outputs of scaling circuits 37 and the trial voltage produced internally by digital-to-analog converter 35 is provided across output terminals 36 and 38 by summing circuits 39. Comparator 30 determines whether a given trial voltage is greater than or less than the scaled input voltage by determining whether the difference between these signals is positive or negative. Comparator 30 provides a corresponding digital output signal to successive approximation register 32 via line 40. If the scaled input voltage across exceeds the trial voltage, the trial voltage is increased. If the scaled input voltage is less than the trial voltage, the trial voltage is decreased.

Typically, control circuitry 28 initially sets the trial voltage to one half of the full voltage range of analog-to-digital converter 20 by making the most significant bit of the digital code on bus 42 equal to one and the remaining bits equal to zero. The first comparison between the input voltage and the trial voltage therefore determines whether the input voltage exceeds one half of the full voltage. If the input voltage is greater than or equal to the trial voltage, the value of the most significant bit is maintained at one. If the input voltage is less than the trial voltage, the value of the most significant bit is set to zero. Control circuitry 28 repeats this process

4 using progressively less significant bits until all bits of successive approximation register 32 have been set to either one or zero. Completing the digitization of an input signal with a n-bit successive approximation register 32 involves n comparison steps.

Successive approximation analog-to-digital converters such as analog-to-digital converter 20 are generally satisfactory. However, subjecting analog-to-digital converter 20 to input voltages of large magnitudes can adversely affect the performance of the circuitry in comparator 30 when used for high-accuracy analog-to-digital conversion.

Figure 2:
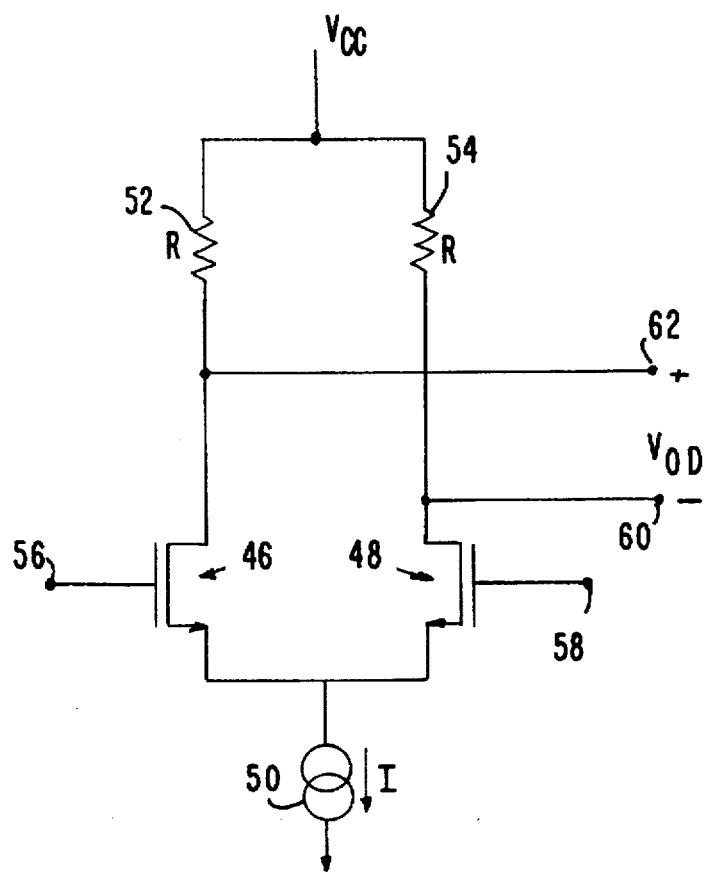
FIG. 2 is a circuit diagram of a conventional MOS transistor differential amplifier.
Figure 3A:
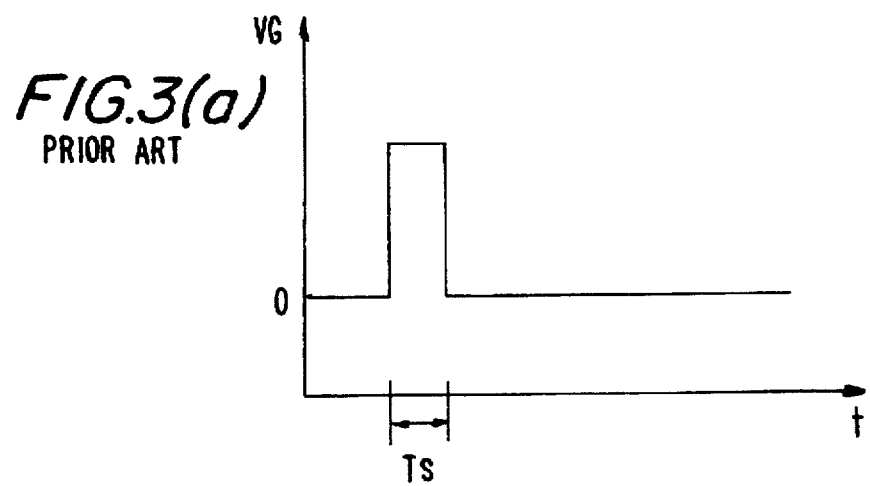
FIG. 3 is a diagram showing the effects of voltage threshold hysteresis on the output of the differential amplifier of FIG. 2; (a) shows an illustrative input voltage applied to one of the differential inputs of the amplifier, and (b) shows the corresponding output voltage.
Figure 3B:
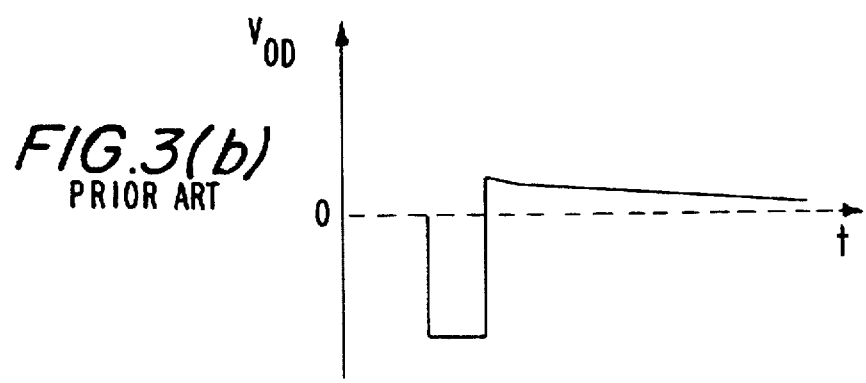

As shown in FIG. 2, differential input stage 44, which forms the input of comparator 30 (FIG. 1), has metal-oxide-semiconductor transistors 46 and 48 that are biased by current source 50 and resistors 52 and 54. Gate terminals 56 and 58 are connected to digital-to-analog converter block output terminals 36 and 38, respectively. Under normal operating conditions, when a large differential voltage is applied across terminals 56 and 58, a change in the voltage thresholds of transistors 46 and 48 can occur. It is believed that trapped charge carriers in the gate oxides of transistors 46 and 48 produce changes in the voltage thresholds of transistors 46 and 48, which persist until all carriers have been emitted by the traps in the gate oxides. As shown in FIG. 3, if a voltage $V_G$ of pulse duration of $T_S=100$ ns is applied to terminal 56 (FIG. 2) while terminal 58 (FIG. 2) is at ground potential, an output voltage $V_{OD}$ (FIG. 3(b)) will be produced across terminals 60 and 62 (FIG. 2) that has a significantly longer decay time than $T_S$, because of the relatively long lifetime of the carriers captured by traps in the gate oxides of transistors 46 and 48 (FIG. 2).

The accuracy of analog-to-digital converter 20 (FIG. 1) is critically dependent on the stability of the voltage thresholds of transistors 46 and 48. If the voltage threshold of either transistor 46 or 48 of input stage 44 is altered due to charge trapping, the accuracy of analog-to-digital converter 20 (FIG. 1) will be decreased significantly. Further, trapped carriers are typically emitted over time periods of several microseconds. Because the time periods of interest in analog-to-digital conversion are also on the order of several microseconds, performance degradation in analog-to-digital converter 20 due to voltage threshold hysteresis is particularly serious.

Figure 4:
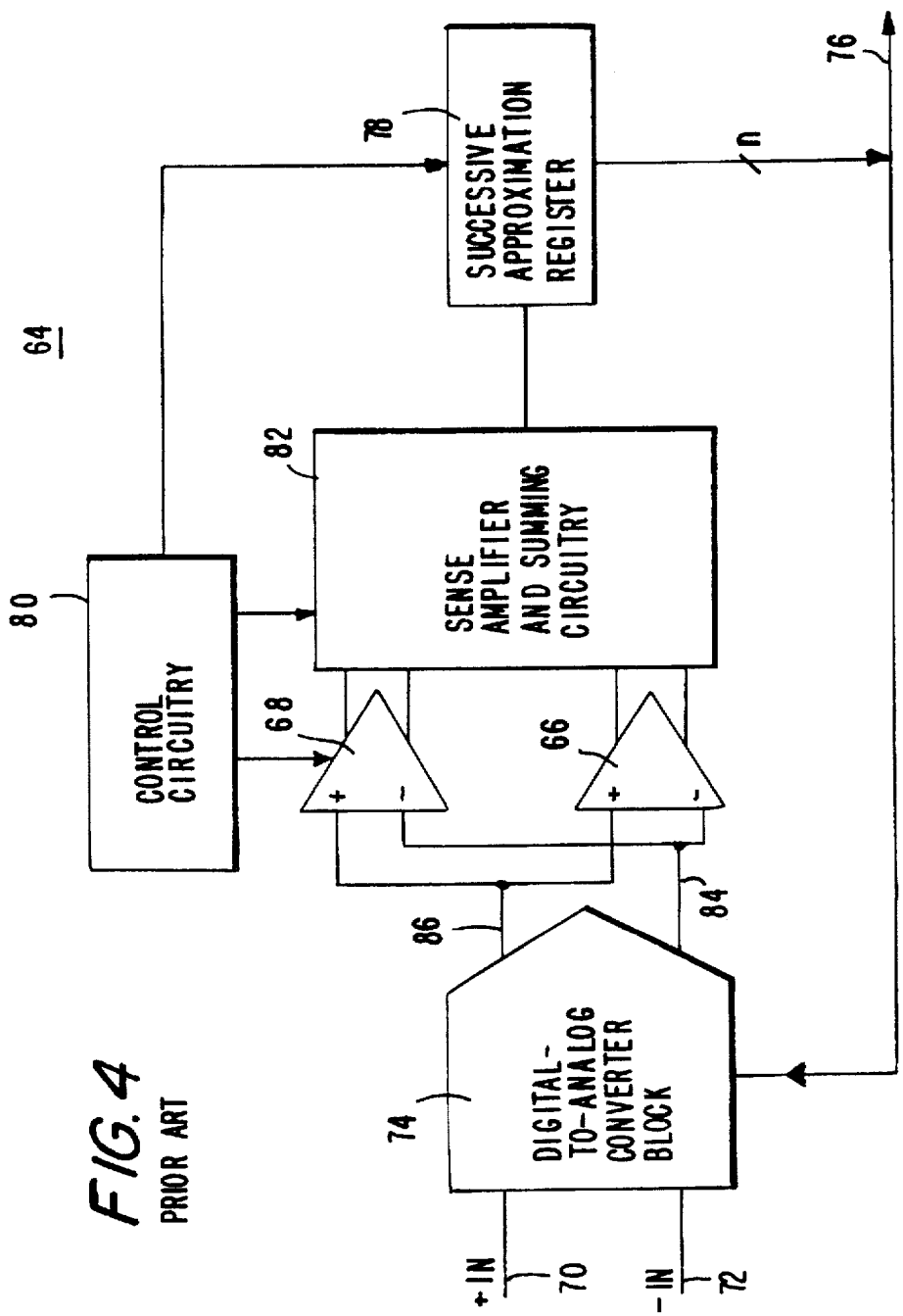
FIG. 4 is a circuit diagram of a conventional successive approximation analog-to-digital converter using two separate comparators.

In order to avoid the adverse effects of voltage threshold hysteresis in MOS transistor input stages, a successive approximation register analog-to-digital converter 64 is known that uses two separate comparator circuits, as shown in FIG. 4. Comparator circuits 66 and 68 digitize the input voltage across terminals 70 and 72 of digital-to-analog converter block 74 and provide an n-bit digital output at output 76 of successive approximation register 78. Comparator circuit 66 processes large input voltages. Comparator circuit 68 processes small input voltages. Control circuitry 80 directs the overall operation of analog-to-digital converter 64.

Figure 5:
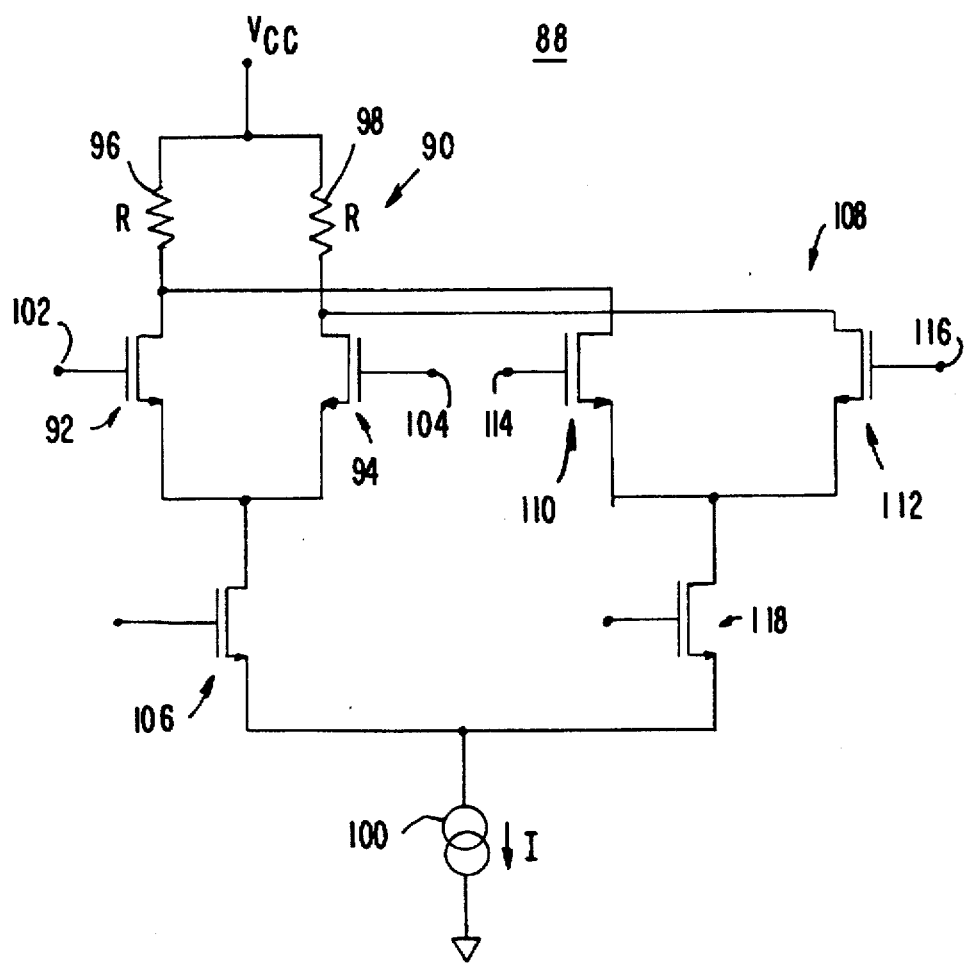
FIG. 5 is a circuit diagram illustrating one method for protecting the input stage of a successive approximation analog-to-digital converter.

Typically, comparator circuit 66 is only used to analyze the polarity of relatively large voltage signals and is not intended to be used for high-accuracy measurements. The effects of voltage threshold hysteresis in the input stage MOS transistors of comparator circuit 66 can generally be neglected. Comparator circuit 68 handles small voltage input signals with greater accuracy than comparator circuit 66. The accuracy of comparator circuit 68 is maintained by shielding the input stage MOS transistors in comparator circuit 68 from exposure to large input voltages using a dummy-pair circuit (FIG. 5). As shown in FIG. 4, the analog output signals from comparator circuits 66 and 68 are received by sense amplifier and summing circuitry 82. A corresponding digital output signal, which indicates whether the signal across output terminals 84 and 86 of digital-to-analog converter block 74 is positive or negative, is provided to successive approximation register 78.

The dummy-pair circuit used with analog-to-digital converter 64 (FIG. 4) is shown in input stage 88 in FIG. 5. Input stage 88 includes differential amplifier 90, which is made up of a pair of transistors 92 and 94, resistors 96 and 98, and current source 100. Input voltages are provided across input terminals 102 and 104. Transistor 106 determines whether current flows to current source 100. Input stage 88 also includes dummy-pair 108, which is based on a pair of transistors 110 and 112. Dummy-pair 108 is biased by resistors 96 and 98 and current source 100. Transistor 118 determines whether current flows through dummy-pair 108 to current source 100. A biasing voltage is applied to input terminals 114 and 116, which places transistors 110 and 112 in saturation.

During the processing of small input voltages, transistor 106 is turned on and transistor 118 is turned off, which allows differential amplifier 90 to operate normally. During processing of large input voltages by comparator circuit 66 (FIG. 4), large voltages appear across terminals 102 and 104 of differential amplifier 90. To shield comparator circuit 68 from the effects of large voltages, transistor switch 106 is turned off and transistor switch 118 is turned on, which shunts current through dummy-pair 108 rather than allowing it to pass through differential amplifier 90. With transistor 106 off, transistors 92 and 94 have no drain-to-source current in hope that the gate oxides of transistors 92 and 94 will be protected from voltage threshold hysteresis.

Although the circuitry of input stage 88 of FIG. 5 is generally suitable for protecting comparator circuit 68 of FIG. 4 while comparator circuit 66 processes large voltages, the dummy-pair design of input stage 88 involves the use of numerous transistors and control signal inputs. As a result, input stage 88 is relatively complex and occupies a relatively large area on the integrated circuit on which input stage 88 is fabricated. In addition, because sense amplifier and summing circuitry 82 of analog-to-digital converter 64 is connected to the outputs of both comparator circuit 66 and comparator circuit 68, when sense amplifier and summing circuitry 82 is processing the signal from one comparator circuit it may be adversely affected by noise from the other comparator circuit. Further, analog-to-digital converter 64 uses duplicative input stage circuitry in comparator circuits 66 and 68. This duplicative circuitry contributes to an increase in the level of noise in analog-to-digital converter 64. Finally, the $V_{GS}$ stress due to the large voltages across terminals 102 and 104 is not eliminated. Rather, the $V_{GS}$ stress occurs in a zero-current conduction. It is not known if removing the bias current in this way fully eliminates the effects of stress.

Another approach that has been used for protecting analog-to-digital converter input stage circuitry from voltage threshold hysteresis due to large differential input voltages is shown in FIG. 6. Analog-to-digital converter 91 has comparator 93 for processing large input signals and comparator 95 for processing small input signals. Comparators 93 and 95 have switches 97, which may be used to disconnect the inputs of comparators 93 and 95 from digital-to-analog converter block 99. Switches 97 may be selectively opened to protect comparator 95 from stress due to large differential input voltages. However, switches 97 add noise and harmonic distortion. Further, when switches 97 are off, the inputs of comparators 93 and 95 are floating, which may cause damage to comparators 93 and 95.

In accordance with the present invention, analog-to-digital converter 120 of FIG. 7 is provided, which is relatively insusceptible to the effects of voltage threshold hysteresis in its input circuitry and which overcomes the disadvantages of previously-known analog-to-digital converters, such as those shown in FIGS. 4, 5, and 6. Analog-to-digital converter 120 has low-resolution comparator circuitry 122 and high-resolution comparator circuitry 124. Low-resolution comparator circuitry 122 processes large input signals from the differential input connected across terminals 142 and 144 and provides corresponding output signals across analog output 126. High-resolution comparator circuitry 124 processes small input signals from the differential input connected across terminals 142 and 144 and provides corresponding output signals across analog output 128.

Analog-to-digital converter 120 is insensitive to voltage threshold hysteresis effects, because the accuracy of high-resolution comparator circuitry 124 is preserved by protecting the MOS transistors in the input stage of high-resolution comparator circuitry 124 from being exposed to large gate-source voltages when low-resolution comparator circuitry 122 processes large input signals. Analog-to-digital converter 120 digitizes input signals using a binary search approach somewhat similar to that used by standard successive approximation analog-to-digital converters. Analog-to-digital converter 120 receives analog input signals across input terminals 130 and 132. After digitization, digital output signals are provided at outputs 134 and 136. Sense amplifier and successive approximation register circuitry 138 contains sense amplifier circuitry that converts the analog output signals on outputs 126 and 128 to digital output signals (e.g., digital ones for positive signals and digital zeros for negative signals).

Sense amplifier and successive approximation register circuitry 138 also contains successive approximation register circuitry that is used to store digital codes corresponding to trial signals of various magnitudes. The digital codes stored in the successive approximation register circuitry are each made up of $n_1$ most significant bits and $n_2$ least significant bits. The most significant bits are provided at output 134 and the least significant bits are provided at output 136. Digital-to-analog converter block 140 generates trial signals based on the digital code. The trial signals are subtracted from the input signal received across input terminals 130 and 132 and the resulting difference signal is provided to low resolution comparator circuitry 122 and high-resolution comparator circuitry 124 via terminals 142 and 144.

Control circuitry 146 controls the overall operation of analog-to-digital converter 120. For example, control circuitry 146 provides control signals via path 150 to shield high-resolution comparator circuitry 124 from the effects of voltage threshold hysteresis in its input circuitry. In addition, control circuitry 146 directs sense amplifier and successive approximation register circuitry 138 to generate the digital codes used by digital-to-analog converter block 140 to produce the trial signals.

In operation, low-resolution comparator circuitry 122, high-resolution comparator circuitry 124 and sense amplifier and successive approximation register circuitry 138 determine whether a given trial signal is greater than or less than the input voltage across terminals 130 and 132 by determining whether the difference between these signals is positive or negative. If the input signal exceeds the trial signal, the trial signal is increased. If the input signal is less than the trial signal, the trial signal is decreased.

Control circuitry 146 preferably sets the trial signal magnitude to one half of the full range of analog-to-digital converter 120 by making the most significant bit of the digital code equal to one and the remaining bits equal to zero. The first comparison between the input signal and the trial signal therefore determines whether the input signal exceeds one half of the full signal range. If the input signal is greater than or equal to the trial signal, the value of the most significant bit is maintained at one. If the input signal is less than the trial signal, the value of the most significant bit is set to zero. This process is repeated using progressively less significant bits until all of the bits at digital outputs 134 and 136 have been set to either one or zero.

Determining the values of the $n_1$ most significant bits with low-resolution comparator circuitry 122 involves $n_1$ steps. Determining the values of the $n_2$ least significant bits with high-resolution comparator circuitry 124 involves $n_2$ steps. Preferably, an additional error-correction step is also performed after completing the $n_1$ steps involved in digitizing the most significant bits, but before initiating the $n_2$ steps involved in digitizing the least significant bits. The error correction step involves making an additional determination of the correct value for the $n_1$ most significant bits using high-resolution comparator circuitry 124. If an error is detected during this step, the value of the $n_1$ most significant bits can be corrected before proceeding to determine the values of the remaining bits.

If desired, sense amplifier and successive approximation register circuitry 138 can contain summing circuitry for combining the analog output signals from outputs 126 and 128 before converting these signals to digital control signals. If sense amplifier and successive approximation register circuitry 138 contains such summing circuitry, a single successive approximation register (not shown) is used to store the digital codes for digital-to-analog converter block 140.

As shown in FIG. 8, an alternative approach, in accordance with the principles of the present invention, involves forming sense amplifier and successive approximation register circuitry 152 using two sets of sense amplifiers and successive approximation registers. Sense amplifier 154 and low-resolution successive approximation register 156 are used to process signals from low-resolution comparator circuitry 158. Sense-amplifier 160 and high-resolution successive approximation register 162 process signals from high-resolution comparator circuitry 164. Because the outputs of low-resolution comparator circuitry 158 and high-resolution comparator circuitry 164 are processed independently by sense amplifiers 154 and 160, analog-to-digital converter 166 of FIG. 8 is less susceptible to noise than successive approximation analog-to-digital converter arrangements in which comparator outputs are summed together prior to sense amplifier processing.

FIG. 9 shows comparator circuitry 168 that is suitable for use in analog-to-digital converter 120 of FIG. 7 or analog-to-digital converter 166 of FIG. 8. Comparator circuitry 168 receives signals from a digital-to-analog converter block (not shown in FIG. 9) via differential input terminals 170 and 172. Analog output signals are provided at outputs 174 and 176. Low-resolution comparator circuitry 178 handles large magnitude input signals (e.g., signals with voltages greater than approximately 50 mV). High-resolution comparator circuitry 180 handles small input signals (e.g., signals with voltages less than approximately 50 mV).

Low-resolution comparator circuitry 178 has an input stage 182 formed from MOS transistors 184 and 186, resistors 188 and 190, and current source 193. Preferably, resistors 188 and 190 each have a resistance value of approximately 1 kΩ. Current source 192 is preferably a 2 mA current source, which biases transistors 184 and 186 in saturation. Input stage 182 amplifies the input signal across differential input terminals 192 and 194, which drive the gates of transistors 184 and 186, and provides a corresponding output signal across terminals 196 and 198. Low-resolution comparator circuitry 178 preferably processes the signal across terminals 196 and 198 with differential stage 200. The analog signal at output 174 of differential stage 200 is processed by sense amplifier circuitry (not shown in FIG. 9).

Capacitors 202 and 204 are used to cancel the well-known offset voltage in input stage 182. When it is desired to cancel the offset voltage, auto-zero transistors 206 and 208 are turned on via auto-zero control line 210, which is activated by the control circuit (not shown in FIG. 9). Turning on auto-zero transistors 206 and 208 connects nodes 212 and 214 to ground potential 216. Auto-zero transistors 218, 220, and 222 are turned on via auto-zero control line 224 (shown as part of high-resolution comparator circuitry 180 in FIG. 9), thereby connecting input terminals 170 and 172 to ground potentials 226 and 228. During the period in which auto-zero transistors 206, 208, 218, 220, and 222 are on, an offset cancellation voltage equal to the offset voltage of differential amplifier input stage 182 multiplied by the gain of differential amplifier input stage 182 is stored across capacitors 202 and 204. During normal operation, auto-zero transistors 206, 208, 218, 220, and 222 are turned off, and the offset cancellation voltage stored across capacitors 202 and 204 automatically cancels the offset voltage in input stage 182.

When low-resolution comparator circuitry 178 is in use, relatively large signals are received across input terminals 170 and 172. In order to protect high-resolution comparator circuitry 180, input protection transistor 230 is turned off via control line 232, which is connected to control circuitry (not shown in FIG. 9). With input protection transistor 230 off, current sources 234 and 236, transistors 238 and 240, and resistors 242 and 244 of input stage 246 form a source follower pair. Preferably, resistors 242 and 244 each have a resistance of 1 kΩ. Current sources 234 and 236, which are preferably 1 mA current sources, bias transistors 238 and 240 in saturation. Because transistors 238 and 240 form a source follower pair, when the gate of transistor 238 or 240 is subjected to a large voltage pulse, the source voltage of that transistor follows the gate voltage instantaneously, to maintain a constant gate-source voltage. It is therefore not possible to develop gate-source voltages across transistors 238 and 240 large enough to alter the voltage threshold of transistors 238 and 240 when input protection transistor 230 is off.

When it is desired to process the input signal across input terminals 170 and 172 with high-resolution comparator circuitry 180, rather than low-resolution comparator circuitry 178, input protection transistor 230 is turned on. With input protection transistor 230 on, current sources 234 and 236 combine to form a single 2 mA current source, which places input stage 246 in a differential amplifier configuration. The output of input stage 246 in this configuration is provided across terminals 248 and 250. The analog output signal across terminals 248 and 250 is preferably processed by differential stages 252 and 253 and provided to analog output 176.

Capacitors 258 and 260 are used to cancel the offset voltage of input stage 246. To cancel the offset voltage of input stage 246, auto-zero transistors 262 and 264 are turned on via auto-zero control line 266, which is activated by the control circuit (not shown in FIG. 9). Transistor 230 is turned on during auto-zeroing. Turning on auto-zero transistors 262 and 264 connects nodes 268 and 270 to ground potential 272. Auto-zero transistors 218, 220, and 222 are turned on via auto-zero control line 224, which connects input terminals 170 and 172 to ground potentials 226 and 228. During the period in which auto-zero transistors 262, 264, 218, 220, and 222 are on, and transistor 230 is on, an offset cancellation voltage equal to the offset voltage of input stage 246 multiplied by the gain of input stage 246 is stored across capacitors 258 and 260. During normal operation, auto-zero transistors 262, 264, 218, 220, and 222 are turned off, and the offset cancellation voltage stored across capacitors 202 and 204 automatically cancels the offset voltage of input stage 246.

Capacitors 255 and 257 are used to cancel the offset voltage of stage 252. During auto-zeroing, capacitors 255 and 257 are connected to ground potential 259 by transistors 261 and 263.

One advantage of the circuit arrangement shown in FIG. 9, is that it allows a single transistor (input protection transistor 230) to be used to provide input protection for high-resolution comparator circuitry 180, rather than a complex dummy-pair arrangement, such as used in input stage 88 of FIG. 4. Reducing the complexity of the input protection circuitry for comparator circuitry 168 of analog-to-digital converters 120 and 166 makes analog-to-digital converters 120 and 166 more reliable and more economical to manufacture. In addition, no large voltages appear across the input stage transistors in the high-resolution circuitry of FIG. 9, so there is no $V_{GS}$ stress, whereas the dummy-pair arrangement of FIG. 4 only removes the bias current from the input stage transistors during periods of $V_{GS}$ stress. Further, there is less capacitance on the drains of the input stage transistors than with the dummy-pair arrangement.

Another aspect of the present invention involves providing common input circuitry for use with both low-resolution comparator circuitry and high-resolution comparator circuitry in a successive approximation analog-to-digital converter. As shown in FIG. 10, successive approximation analog-to-digital converter 274 receives analog input signals across terminals 276 and 278 and provides digital output signals at outputs 280 and 282. Control circuitry 284 controls the overall operation of analog-to-digital converter 274. For example, control circuitry 284 preferably directs sense amplifier and successive approximation circuitry 286 to provide trial codes to digital-to-analog converter block 288 to implement a binary search pattern.

A difference signal proportional to the difference between the input signal across terminals 276 and 278 and a trial signal generated internally by digital-to-analog converter block 288 (based on the trial code from sense amplifier and successive approximation register circuitry 286) is provided across output terminals 290 and 292. Large signals across output terminals 290 and 292 (e.g., signals greater than 50 mV) are handled by low-resolution comparator circuitry 294 and small signals (e.g., signals less than 50 mV) are handled by high-resolution comparator circuitry 296.

Analog-to-digital converter 274 includes input circuit 302, which provides signals to both high-resolution comparator circuitry 296 and low-resolution comparator circuitry 294. Input circuit 302 has a differential input and contains differential amplifier circuitry for processing signals received across terminals 290 and 292. In addition, input circuit 302 receives control signals from control circuitry 284 via line 304. When the signals across terminals 290 and 292 are large, the control signals direct input circuit 302 to provide processed analog output signals to low-resolution comparator circuitry 294 via analog output 306. When the signals across terminals 290 and 292 are small, the control signals direct input circuit 302 to provided processed analog output signals to high-resolution comparator circuitry 296 via analog output 308. The MOS transistors in input circuit 302 are relatively unaffected by voltage threshold changes induced by trapped carriers, because input circuit 302 contains circuitry that prevents large gate-source voltages from developing in the input stage transistors of input circuit 302.

If desired, sense amplifier and successive approximation register circuitry 286 can contain summing circuitry for combining the analog output signals from analog output 310 of low-resolution comparator circuitry 294 and analog output 312 of high-resolution comparator circuitry 296 before converting these signals to digital output signals. The digital output signals—ones for positive signals and zeros for negative signals—are used by the successive approximation register circuitry within sense amplifier and successive approximation register circuitry 286 to determine whether the trial signals generated by digital-to-analog converter block 288 based on given digital codes are greater or less than the input signals across terminals 276 and 278. If sense amplifier and successive approximation register circuitry 286 contains summing circuitry, a single sense amplifier and a single successive approximation register are used to store the digital codes for digital-to-analog converter block 288.

Control circuitry 284 preferably sets the initial magnitude of the trial signal to be generated by digital-to-analog converter block 288 to one half of the full range of analog-to-digital converter 274 by making the most significant bit of the digital code in sense amplifier and successive approximation register circuitry 286 equal to one and the remaining bits equal to zero. The first comparison between the input signal across terminals 276 and 278 and the trial signal therefore determines whether the input signal exceeds one half of the full signal range. If the input signal is greater than or equal to the trial signal, the value of the most significant bit is maintained at one. If the input signal is less than the trial signal, the value of the most significant bit is set to zero. This process is repeated using progressively less significant bits until all of the bits at digital outputs 280 and 282 have been set to either one or zero.

Determining the values of the $n_1$ most significant bits at output 280 with low-resolution comparator circuitry 294 involves $n_1$ steps. Determining the values of the $n_2$ least significant bits at output 282 with high-resolution comparator circuitry 296 involves $n_2$ steps. Preferably, an additional error-correction step is also performed after completing the $n_1$ steps involved in digitizing the most significant bits, but before initiating the $n_2$ steps involved in digitizing the least significant bits. The error correction step involves making an additional determination of the correct value for the $n_1$ most significant bits using high-resolution comparator circuitry 296. If an error is detected during this step, the value of the $n_1$ most significant bits can be corrected before proceeding to determine the values of the remaining bits.

An analog-to-digital converter arrangement in which two channels of circuitry are used for processing the signals from low-resolution and high-resolution comparators is shown in FIG. 11. Sense amplifier and successive approximation register circuitry 314 of analog-to-digital converter 316 is formed using sense amplifiers 318 and 324 and successive approximation registers 326 and 320. Sense amplifier 318 and low-resolution successive approximation register 320 are used to process signals from low-resolution comparator circuitry 322. Sense-amplifier 324 and high-resolution successive approximation register 326 process signals from high-resolution comparator circuitry 328. Because the outputs of low-resolution comparator circuitry 322 and high-resolution comparator circuitry 328 are processed independently by sense amplifiers 318 and 324, analog-to-digital converter 316 is less susceptible to noise than successive approximation analog-to-digital converter arrangements in which analog comparator outputs are summed together prior to sense amplifier processing.

FIG. 12 shows comparator circuitry 330 that is suitable for use in analog-to-digital converter 274 of FIG. 10 or analog-to-digital converter 316 of FIG. 11. Comparator circuitry 330 receives signals from digital-to-analog converter block circuitry (not shown in FIG. 12) via differential input terminals 332 and 334. Processed analog output signals are provided at outputs 336 and 338. Input circuit 340 acts as an input buffer by presenting a high input impedance to signals applied across terminals 332 and 334. Input circuit 340 uses input stage 342 to process large magnitude input signals and provide corresponding processed analog output signals across output terminals 344 and 346. Input circuit 340 uses input stage 348 to process smaller magnitude input signals and provide corresponding processed analog output signals across output terminals 350 and 352. Input protection transistor 354 is switched off or on by control circuitry (not shown in FIG. 12) depending on whether it is desired to process large or small magnitude input signals with input circuit 340.

Input stage 348 has transistors 356 and 358, resistors 360 and 362, and current sources 364 and 366. Input stage 342 has transistors 368 and 370, resistors 372 and 374 and current source 376. Preferably, current sources 364 and 366 are 1 mA current sources and current source 376 is a 2 mA current source. Resistors 360, 362, 372, and 374 preferably have resistance values of approximately 1 kΩ each.

When it is desired to process large input signals to determine the values of the most significant bits of the digital code, input protection transistor 354 is turned off. With input protection transistor 354 off, transistors 356 and 358 form a source follower pair biased in saturation by current sources 364 and 366. Because transistors 356 and 358 form a source follower pair, when the gate of either transistor 356 or 358 is subjected to a large voltage pulse, the source voltage of that transistor follows the gate voltage substantially instantaneously, thereby maintaining a constant gate-source voltage. As a result, when input protection transistor 354 is off, it is not possible to develop gate-source voltages across transistors 356 and 358 that are large enough to cause voltage threshold shifts in the gate oxides of transistors 356 and 358.

The source follower pair made up of transistors 356 and 358 when input protection transistor 354 is off acts as an input buffer, so that the input signals across terminals 332 and 334 appear as buffered signals across input terminals 378 and 380 of input stage 342. Input stage 342, which is a differential amplifier, provides a corresponding output signal across terminals 344 and 346. The analog output signal across terminals 344 and 346 is preferably further processed by differential stage 382 of low-resolution comparator circuitry 384 and the resulting analog output signal provided at analog output 338. The values of the most significant bits of the digital code are therefore determined using input stage 348 as a source follower pair and using input stage 342 and low-resolution comparator circuitry 384 for further signal processing.

When it is desired to determine the values of the least significant bits of the digital code, input protection transistor 354 is turned on. With input protection transistor 354 on, input terminals 378 and 380 of input stage 342 are shorted together, thereby isolating input stage 342 from input terminals 332 and 334. In addition, current sources 364 and 366 combine to form a single 2 mA current source, which places input stage 348 in a differential amplifier configuration. The output of input stage 348 in this configuration is provided across terminals 350 and 352.

Because transistors 356 and 358 were shielded from large gate-source voltages during the processing of large magnitude input voltages across input terminals 332 and 334, the threshold voltages of transistors 356 and 358 are unaffected by charge trapping effects. Input stage 348 is therefore highly accurate, which facilitates the handling of the small magnitude signals that must be processed to determine the values of the least significant digital code bits. The analog output signal across terminals 350 and 352 is preferably processed by differential stages 386 and 388 of high-resolution comparator circuitry 390 and provided to output 336.

To cancel offset voltages, comparator circuitry 330 has auto-zero transistors 398, 400, 402, 404, 406, 408, 410, 412, and 414, which are used to connect various nodes in comparator circuitry 330 to ground potentials 416, 418, 420, 422, and 424. Auto-zero control signals are applied to auto-zero transistors 398, 400, 402, 404, 406, 408, 410, 412, and 414 using control lines 426, 428, and 430.

Capacitors 432 and 434 are used to cancel the offset voltage of differential stage 386. Capacitors 436 and 438 are used to cancel the offset voltage of input stage 342 and capacitors 440 and 442 are used to cancel the offset voltage of input stage 348.

Because input stages 342 and 348 involve the use of common circuitry, such as transistors 356 and 358 and input protection transistor 354, voltage offset from input stage 348 can influence the output voltage produced by input stage 342 across output terminals 344 and 346 during normal operation. If desired, capacitors 444 and 446 can be added to comparator circuitry 330 to cancel this additional voltage offset effect.

The voltage offset of input stage 348 can be cancelled by applying the output voltage from input stage 348 across capacitors 440 and 442 during an auto-zeroing step. During this step, transistors 398, 400, and 402 are turned on, which shorts nodes 378 and 380 together, thereby connecting input terminals 332 and 334 to ground potentials 416 and 418. Transistors 404 and 406 are turned on to connect nodes 448 and 450 to ground potential 420. Input protection transistor 354 is also turned on, to place input stage 348 in the differential amplifier configuration. Under these conditions, a voltage of $A_1 V_{OS1}$ develops across terminals 350 and 352 and capacitors 440 and 442. $A_1$ is the gain of input stage 348 and $V_{OS1}$ is the offset voltage of input stage 348. Preferably, the value of gain $A_1$ is approximately 10 and capacitors 440 and 442 each have a value of approximately 2 pF. The offset voltage $V_{OS1}$ results primarily from the mismatch between transistors 356 and 358 that results during circuit fabrication. Secondary contributions to the offset voltage of input stage 348 result from the mismatch between resistors 360 and 362 and the mismatch between current sources 364 and 366. These secondary contributions can be included in offset voltage $V_{OS1}$ without a loss of generality.

During the auto-zeroing step, charge is stored on capacitors 440 and 442 in proportion to the voltage $A_1V_{OS1}$. During normal operation, this charge produces a voltage of magnitude $A_1V_{OS1}$ across capacitors 440 and 442 that cancels the voltage offset produced by input stage 348.

The voltage offset of input stage 342 can be cancelled similarly by applying the output voltage from input stage 342 across capacitors 436 and 438 during the auto-zeroing step. Transistors 398, 400, and 402 are turned on during auto-zeroing, which connects input terminals 332 and 334 to ground potentials 416 and 418. Transistors 412 and 414 are turned on to connect nodes 452 and 454 to ground potential 424. Input protection transistor 354 is also turned on. Under these conditions, the voltage offset $V_{OS2}$ of input stage 342 causes a voltage of $A_2V_{OS2}$ to develop across terminals 344 and 346 and capacitors 436 and 438. $A_2$ is the gain of input stage 342, which preferably has a value of approximately 10. Capacitors 436 and 438 preferably each have a value of approximately 2 pF. The offset voltage $V_{OS2}$ results primarily from the mismatch between transistors 368 and 370. The mismatch between resistors 372 and 374 also can also be included in $V_{OS2}$ without a loss of generality.

During the auto-zeroing step, charge is stored on capacitors 436 and 438 in proportion to the voltage $A_2V_{OS2}$. During normal operation, this charge produces a voltage of magnitude $A_2V_{OS2}$ across capacitors 436 and 438 that cancels the voltage offset produced by input stage 342.

In many situations, using capacitors 440 and 442 to cancel the voltage offset effects of input stage 348 and using capacitors 436 and 438 to cancel the voltage offset effects of input stage 342 without using additional capacitors such as capacitors 444 and 446 is satisfactory. However, if capacitors 444 and 446 are omitted from comparator circuitry 330, there is an additional uncompensated voltage offset $V_{OS1}$ that will appear across the input stage 342 as a result of opening switch 354. This additional voltage offset can be cancelled by providing capacitors 444 and 446, thereby maximizing the accuracy of comparator circuitry 330.

The additional voltage offset is produced by opening switch 354, because input terminals 378 and 380 are connected across the sources of transistors 356 and 358 of input stage 348. During normal operation, input protection transistor 354 is off and a voltage contribution equal to the offset voltage $V_{OS1}$ appears across terminals 378 and 380. A voltage contribution $A_1V_{OS1}$ due to this offset appears across terminals 350 and 352, but is cancelled by the voltage that was stored across capacitors 440 and 442 during the auto-zeroing step. A voltage contribution $A_2V_{OS2}$ due to the offset voltage of input stage 342 appears across terminals 344 and 346, but is cancelled by the voltage that was stored across capacitors 436 and 438 during auto-zeroing. However, the offset $V_{OS1}$ across terminals 378 and 380, which is amplified by the gain $A_2$ of input stage 342, makes a voltage contribution $A_2V_{OS1}$ across terminals 344 and 346. Capacitors 444 and 446 are provided to cancel the voltage contribution $A_2V_{OS1}$.

During the auto-zeroing step, nodes 456 and 458 are connected to ground potential 424 and a voltage of $A_1V_{OS1}$ appears across terminals 350 and 352. Accordingly, a voltage of $A_1V_{OS1}$ is stored across capacitors 444 and 446. As shown in FIG. 12, capacitors 436, 438, 444, and 446, form a voltage divider. Preferably, capacitors 436 and 438 have the capacitance value $C_2$ and capacitors 444 and 446 have the capacitance value $C_1$. Due to the voltage divider formed by capacitors 436, 438, 444, and 446, the output voltage across terminals 456 and 458 will be a weighted average of the voltage across 344 and 346 and the voltage across 350 and 352. Using superposition, the voltage contribution $A_2V_{OS1}$ that appears across terminals 344 and 346 during normal operation results in a voltage contribution of $A_2V_{OS1}C_2/(C_1+C_2)$ across nodes 456 and 458. The opposing voltage contribution across nodes 456 and 458 arising from the voltage $A_1V_{OS1}$ previously stored across capacitors 444 and 446 during auto-zeroing is equal to $A_1V_{OS1}C_1/(C_1+C_2)$. In order for the voltage stored across capacitors 444 and 446 during auto-zeroing to cancel the voltage contribution of $A_2V_{OS1}C_2/(C_1+C_2)$ across nodes 456 and 458 during normal operation, these two values must be equal, as shown in Equation 1.

$$A_1 V_{OS1} \frac{C_1}{(C_1+C_2)} = A_2 V_{OS1} \frac{C_2}{(C_1+C_2)} \quad (1)$$

Solving for $C_1$ results in Equation 2.

$$C_1 = \frac{A_2}{A_1} C_2 \quad (2)$$

If $A_1$ and $A_2$ are 10 and $C_2$ is 2 pF, then $C_1$ is preferably 2 pF.

The digital outputs of analog-to-digital converters 274 (FIG. 10) and 316 (FIG. 11) contain $n_1$ most significant bits and $n_2$ least significant bits. Determining the values of the $n_1$ most significant bits with low-resolution comparator circuitry 384 involves $n_1$ steps. Determining the values of the $n_2$ least significant bits with high-resolution comparator circuitry 390 involves $n_2$ steps. Preferably, an additional error-correction step is performed before completely digitizing the input signal. The error correction step involves making an additional determination of the correct value for the $n_1$ most significant bits using high-resolution comparator circuitry 390. If an error is detected during this step, the value of the $n_1$ most significant bits can be corrected before proceeding to determine the values of the remaining bits.

When the highest accuracy possible is desired, the design of comparator circuitry 330 should include capacitors 444 and 446 to cancel the additional offset voltage due to the opening of switch 354 during normal operation. Acceptable performance can also be obtained with comparator circuitry 330 if capacitors 444 and 446 are omitted if the offset due to transistors 356 and 358 is sufficiently low. Regardless of which design is used for comparator circuitry 330, the transition bit error correction step is preferably performed to ensure that the value for the $n_1$ most significant bits determined by low-resolution circuitry 384 is correct. However, if capacitors 444 and 446 are omitted, the error correction step is preferably performed on a more significant bit than if capacitors 444 and 446 are used. For example, in a 16 bit analog-to-digital converter in which bit 16 is the most significant bit, the error correction step can be performed after bit 10 or 11 if capacitors 444 and 446 are omitted, rather than after bit 9 when capacitors 444 and 446 are used.

One skilled in the art will appreciate that the present invention can be practiced by other than the described embodiments, which are presented for purposes of illustration and not of limitation, and that the present invention is limited only by the claims that follow.

What is claimed is:

1. Circuitry for use in a successive approximation analog-to-digital converter having a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said circuitry comprising:

low-resolution comparator circuitry having a differential analog input and an analog output, said low-resolution comparator circuitry receiving said analog output signals from said analog output of said digital-to-analog converter block with said differential analog input and providing corresponding analog output of the low resolution comparator circuitry signals at said analog output; and high-resolution comparator circuitry having a differential analog input, an analog output, an input protection transistor, and an input stage formed from a pair of transistors with gate terminals connected to said differential analog input of the high resolution comparator circuitry, drain terminals connected to said analog output, and source terminals across which said input protection transistor is connected, wherein:

when said input protection transistor is on, said input stage forms a differential amplifier and said high-resolution comparator circuitry receives said analog output signals from said analog output of said digital-to-analog converter block with said differential analog input and provides corresponding analog output signals at said analog output of said high-resolution comparator circuitry; and when said input protection transistor is off said input stage forms a source follower pair.

2. The circuitry defined in claim 1 further comprising sense amplifier and successive approximation register circuitry connected to said analog output of said high-resolution comparator circuitry for receiving said analog output signals from said high-resolution comparator circuitry and connected to said analog output of said low-resolution comparator circuitry for receiving said analog output signals from said low-resolution comparator circuitry, said sense amplifier and successive approximation register circuitry providing said digital codes to said digital-to-analog converter block, said digital codes having a plurality of most significant bits and a plurality of least significant bits.

3. The circuitry defined in claim 2 wherein said sense amplifier and successive approximation register circuitry comprises:

a first sense amplifier connected to said analog output of said high-resolution comparator circuitry for receiving said analog output signals from said high-resolution comparator circuitry and for generating corresponding first digital control signals;

a high-resolution successive approximation register connected to said first sense amplifier for receiving said first digital control signals and providing said plurality of said least significant bits of said digital code;

a second sense amplifier connected to said analog output of said low-resolution comparator circuitry for receiving said analog output signals from said low-resolution comparator circuitry and for generating corresponding second digital control signals; and a low-resolution successive approximation register connected to said second sense amplifier for receiving said second digital control signals and providing said plurality of said most significant bits of said digital code.

4. The circuitry defined in claim 1 wherein said low-resolution comparator circuitry further comprises a differential stage coupled between said differential analog input and said analog output of said low-resolution comparator circuitry.

5. The circuitry defined in claim 1 wherein said high-resolution comparator circuitry further comprises a differential stage with input terminals coupled to said drain terminals of said input stage and output terminals coupled to said analog output of said high-resolution comparator circuitry.

6. The circuitry defined in claim 1 wherein said high-resolution comparator circuitry further comprises two equal current sources connected to said source terminals of said input stage transistors for biasing said input stage transistors in saturation.

7. The circuitry defined in claim 1 further comprising circuitry for cancelling offset voltage effects in said high-resolution comparator circuitry and said low-resolution comparator circuitry.

8. Circuitry for use in a successive approximation analog-to-digital converter having a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said circuitry comprising:

low-resolution comparator means for receiving said analog output signals from said analog output of said digital-to-analog converter block with a differential analog input and providing corresponding analog output signals;

high-resolution comparator means for receiving said analog output signals from said analog output of said digital-to-analog converter block with a differential analog input and providing corresponding analog output signals; and means for placing said high-resolution comparator means in one of:

(a) a differential amplifier configuration; and (b) a source follower pair configuration.

9. The circuitry defined in claim 8 further comprising sense amplifier and successive approximation register means connected to said high-resolution comparator means and said low-resolution comparator means for receiving said analog output signals from said high-resolution comparator means and said low-resolution comparator means, said sense amplifier and successive approximation register means providing said digital codes to said digital-to-analog converter block, said digital codes having a plurality of most significant bits and a plurality of least significant bits.

10. The circuitry defined in claim 9 wherein said sense amplifier and successive approximation register means comprises:

first sense amplifier means connected to said high-resolution comparator means for receiving said analog output signals from said high-resolution comparator means and generating corresponding first digital control signals;

high-resolution successive approximation register means connected to said first sense amplifier means for receiving said first digital control signals and providing said plurality of said least significant bits of said digital code;

second sense amplifier means connected to said low-resolution comparator means for receiving said analog output signals from said low-resolution comparator means and generating corresponding second digital control signals; and low-resolution successive approximation register means connected to said second sense amplifier means for receiving said second digital control signals and providing said plurality of said most significant bits of said digital code.

11. The circuitry defined in claim 8 wherein said low-resolution comparator means further comprises a differential stage for processing said analog output signals from said analog output of said digital-to-analog converter block.

12. The circuitry defined in claim 8 wherein said high-resolution comparator means further comprises a differential stage for processing said analog output signals from said analog output of said digital-to-analog converter block.

13. The circuitry defined in claim 8 further comprising current source means for biasing said source follower pair configuration in saturation.

14. The circuitry defined in claim 8 further comprising means for cancelling offset voltage effects in said high-resolution comparator means and said low-resolution comparator means.

15. A method for processing signals in an analog-to-digital converter having low-resolution comparator circuitry, high-resolution comparator circuitry, and a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said method comprising the steps of:

receiving said analog output signals from said analog output of said digital-to-analog converter block with said low-resolution comparator circuitry and providing corresponding processed analog output signals;

receiving said analog output signals from said analog output of said digital-to-analog converter block with said high-resolution comparator circuitry and providing corresponding processed analog output signals;

placing said high-resolution comparator circuitry in a differential amplifier configuration when it is desired to process said analog output signals from said analog output of said digital-to-analog converter block; and placing said high-resolution comparator circuitry in a source follower pair configuration when it is desired to protect said high-resolution comparator circuitry.

16. The method defined in claim 15 wherein said analog-to-digital converter further comprises sense amplifier and successive approximation register circuitry connected to said high-resolution comparator circuitry and said low-resolution comparator circuitry, said method further comprising the step of providing said digital codes to said digital-to-analog converter block, said digital codes having a plurality of most significant bits and a plurality of least significant bits.

17. The method defined in claim 16 wherein said sense amplifier and successive approximation register circuitry comprises a first sense amplifier connected to said high-resolution comparator circuitry, a high-resolution successive approximation register connected to said first sense amplifier, a second sense amplifier connected to said low-resolution comparator circuitry, and a low-resolution successive approximation register connected to said second sense amplifier, said method further comprising the steps of:

receiving said processed analog output signals from said high-resolution comparator circuitry and generating corresponding first digital control signals with said first sense amplifier;

receiving said first digital control signals and providing said plurality of said least significant bits of said digital code with said high-resolution successive approximation register;

receiving said processed analog output signals from said low-resolution comparator circuitry and generating corresponding second digital control signals with said second sense amplifier; and receiving said second digital control signals and providing said plurality of said most significant bits of said digital code with said low-resolution successive approximation register.

18. The method defined in claim 15 wherein said low-resolution comparator circuitry contains a differential stage, said method further comprising the step of processing said analog output signals from said digital-to-analog converter block with said differential stage.

19. The method defined in claim 15 wherein said high-resolution comparator circuitry contains a differential stage, said method further comprising the step of processing said analog output signals from said digital-to-analog converter block with said differential stage.

20. The method defined in claim 15 wherein the step of placing said high-resolution comparator circuitry in said source follower pair configuration further comprises the step of biasing said source follower pair configuration in saturation.

21. The method defined in claim 15 further comprising the step of cancelling offset voltage effects in said high-resolution comparator circuitry and said low-resolution comparator circuitry.

22. Circuitry for use in a successive approximation analog-to-digital converter having a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said circuitry comprising:

an input circuit having a differential analog input, a first analog output, a second analog output, an input protection transistor, and a first input stage having a pair of transistors with gate terminals connected to said differential analog input, drain terminals connected to said first analog output, and source terminals across which said input protection transistor is connected;

high-resolution comparator circuitry having an analog input connected to said first analog output of said input circuit and having an analog output; and low-resolution comparator circuitry having an analog input connected to said second analog output of said input circuit and having an analog output, wherein:

when said input protection transistor is on, said first input stage forms a differential amplifier, said first input stage receiving said analog output signals from said analog output of said digital-to-analog converter block with said differential analog input and providing corresponding analog output signals at said first analog output; and when said input protection transistor is off said input stage forms a source follower pair.

23. The circuitry defined in claim 22 further comprising sense amplifier and successive approximation register circuitry connected to said analog output of said high-resolution comparator circuitry for receiving said analog output signals from said high-resolution comparator circuitry and connected to said analog output of said low-resolution comparator circuitry for receiving analog output signals from said low-resolution comparator circuitry, said sense amplifier and successive approximation register circuitry providing said digital codes to said digital-to-analog converter block, said digital codes having a plurality of most significant bits and a plurality of least significant bits.

24. The circuitry defined in claim 23 wherein said sense amplifier and successive approximation register circuitry comprises:
- a first sense amplifier connected to said analog output of said high-resolution comparator circuitry for receiving analog output signals from said high-resolution comparator circuitry and for generating corresponding first digital control signals;
- a high-resolution successive approximation register connected to said first sense amplifier for receiving said first digital control signals and providing said plurality of said least significant bits of said digital code;
- a second sense amplifier connected to said analog output of said low-resolution comparator circuitry for receiving analog output signals from said low-resolution comparator circuitry and for generating corresponding second digital control signals; and
- a low-resolution successive approximation register connected to said second sense amplifier for receiving said second digital control signals and providing said plurality of said most significant bits of said digital code.

25. The circuitry defined in claim 22 wherein said input circuit further comprises a second input stage having a pair of transistors with gate terminals connected across said input protection transistor and drain terminals connected to said second analog output.

26. The circuitry defined in claim 25 wherein said low-resolution comparator circuitry further comprises a differential stage with input terminals coupled to said drain terminals of said second input stage and output terminals coupled to said analog output of said low-resolution comparator circuitry.

27. The circuitry defined in claim 25 further comprising a pair of capacitors coupled between said first analog output and said second analog output of said input circuit to cancel offset voltage effects that arise when said input protection transistor is turned off.

28. The circuitry defined in claim 22 further comprising circuitry for cancelling offset voltage effects in said input circuit, said high-resolution comparator circuitry, and said low-resolution comparator circuitry.

29. The circuitry defined in claim 22 wherein said high-resolution comparator circuitry further comprises a differential stage with input terminals coupled to said drain terminals of said first input stage and output terminals coupled to said analog output of said high-resolution comparator circuitry.

30. The circuitry defined in claim 22 wherein said high-resolution comparator circuitry further comprises two equal current sources connected to the sources of said first input stage transistors for biasing said first input stage transistors in saturation.

31. Circuitry for use in a successive approximation analog-to-digital converter having a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said circuitry comprising:
- input circuit means for receiving an analog input signal with a differential analog input and providing corresponding first and second analog output signals at respective first and second analog outputs, said input circuit means having an input protection transistor and a first input stage having a pair of transistors with gate terminals connected to said differential analog input, drain terminals connected to said first analog output, and source terminals across which said input protection transistor is connected;
- high-resolution comparator means for receiving said first analog output signals, said high-resolution comparator means having an analog output; and
- low-resolution comparator means for receiving said second analog output signals, said low-resolution comparator means having an analog output, wherein:
- when said input protection transistor is on, said first input stage forms a differential amplifier, said first input stage receiving said analog output signals from said analog output of said digital-to-analog converter block with said differential analog input and providing said analog output signals at said first analog output; and
- when said input protection transistor is off said first input stage forms a source follower pair.

32. The circuitry defined in claim 31 further comprising sense amplifier and successive approximation register means connected to said analog outputs of said high-resolution comparator means and said low-resolution comparator means for receiving said analog output signals from said high-resolution comparator means and said low-resolution comparator means, said sense amplifier and successive approximation register means providing said digital codes to said digital-to-analog converter block, said digital codes having a plurality of most significant bits and a plurality of least significant bits.

33. The circuitry defined in claim 32 wherein said sense amplifier and successive approximation register means comprises:
- first sense amplifier means connected to said analog output of said high-resolution comparator means for receiving said analog output signals from said high-resolution comparator means and generating corresponding first digital control signals;
- high-resolution successive approximation register means connected to said first sense amplifier means for receiving said first digital control signals and providing said plurality of said least significant bits of said digital code;
- second sense amplifier means connected to said analog output of said low-resolution comparator means for receiving said analog output signals from said low-resolution comparator means and generating corresponding second digital control signals; and
- low-resolution successive approximation register means connected to said second sense amplifier means for receiving said second digital control signals and providing said plurality of said most significant bits of said digital code.

21

34. The circuitry defined in claim 31 wherein said input circuit means further comprises a second input stage having a pair of transistors with gate terminals connected across said input protection transistor and drain terminals connected to said second analog output.

35. The circuitry defined in claim 34 wherein said low-resolution comparator means further comprises a differential stage for processing said second analog output signals.

36. The circuitry defined in claim 34 further comprising means coupled between said first analog output and said second analog output of said input circuit means for cancelling the offset voltage effects that arise when said input protection transistor is turned off.

37. The circuitry defined in claim 31 further comprising means for cancelling offset voltage effects in said input circuit means, said high-resolution comparator means, and said low-resolution comparator means.

38. The circuitry defined in claim 31 wherein said high-resolution comparator means further comprises a differential stage for processing said analog output signals.

39. The circuitry defined in claim 31 wherein said high-resolution comparator means further comprises current source means connected to the sources of said first input stage transistors for biasing said first input stage transistors in saturation.

40. A method for processing signals in an analog-to-digital converter having a digital-to-analog converter block with an analog input, a digital input, and an analog output, said digital-to-analog converter block receiving analog input signals with said analog input, receiving digital codes with said digital input, and generating trial signals based on said digital codes, said digital-to-analog converter block providing analog output signals at said analog output that are proportional to the difference between said analog input signals and said trial signals, said analog-to-digital converter further having an input circuit with a differential analog input connected to said analog output of said digital-to-analog converter block, first and second analog outputs, an input protection transistor, and a first input stage having a pair of transistors with gate terminals connected to said differential analog input, drain terminals connected to said first analog output, and source terminals across which said input protection transistor is connected, and said analog-to-digital converter also having high-resolution comparator circuitry and low-resolution comparator circuitry, said method comprising the steps of:

receiving said analog output signals from said digital-to-analog converter block with said differential analog input of said input circuit;

processing said analog output signals from said digital-to-analog converter block with said input circuit to provide corresponding first analog output signals at said first analog output;

processing said analog output signals from said digital-to-analog converter block with said input circuit to provide corresponding second analog output signals at said second analog output;

receiving said first analog output signals with said high-resolution comparator circuitry;

receiving said second analog output signals with said low-resolution comparator circuitry;

placing said first input stage in a differential amplifier configuration when it is desired to process said analog output signals from said digital-to-analog converter block to provide said corresponding first analog output signals at said first analog output; and

22 placing said first input stage in a source follower pair configuration when it is desired to protect said pair of transistors in said input stage.

41. The method defined in claim 40, wherein said analog-to-digital converter further comprises sense amplifier and successive approximation register circuitry connected to said high-resolution comparator circuitry and said low-resolution comparator circuitry, said method further comprising the steps of:

receiving analog output signals from said high-resolution comparator circuitry and said low-resolution comparator circuitry with said sense amplifier and successive approximation register circuitry; and providing said digital codes to said digital-to-analog converter block with said sense amplifier and successive approximation register circuitry, said digital codes having a plurality of most significant bits and a plurality of least significant bits.

42. The method defined in claim 41 wherein said sense amplifier and successive approximation register circuitry comprises a first sense amplifier connected to said high-resolution comparator circuitry, a high-resolution successive approximation register connected to said first sense amplifier, a second sense amplifier connected to said low-resolution comparator circuitry, and a low-resolution successive approximation register connected to said second sense amplifier, said method further comprising the steps of:

receiving said analog output signals from said high-resolution comparator circuitry and generating corresponding first digital control signals with said first sense amplifier;

receiving said first digital control signals and providing said plurality of said least significant bits of said digital code with said high-resolution successive approximation register;

receiving said analog output signals from said low-resolution comparator circuitry and generating corresponding second digital control signals with said second sense amplifier; and receiving said second digital control signals and providing said plurality of said most significant bits of said digital code with said low-resolution successive approximation register.

43. The method defined in claim 40 wherein said input circuit further comprises a second input stage having a pair of transistors with gate terminals connected across said input protection transistor and drain terminals connected to said second analog output, said method further comprising the step of providing said second analog output signals across said drain terminals.

44. The method defined in claim 43 wherein said low-resolution comparator circuitry further comprises a differential stage with input terminals coupled to said drain terminals of said second input stage, said method further comprising the step of processing said second analog output signals with said differential stage.

45. The method defined in claim 43 further comprising the step of cancelling offset voltage effects that arise when said input protection transistor is turned off.

46. The method defined in claim 40 further comprising the step of cancelling offset voltage effects in said input circuit, said high-resolution comparator circuitry, and said low-resolution comparator circuitry.

47. The method defined in claim 40 wherein said high-resolution comparator circuitry further comprises a differential stage coupled to said drain terminals of said first input stage, said method further comprising the step of processing said first analog output signals with said differential stage.

48. The method defined in claim 40 wherein said step of placing said first input stage in said source follower pair configuration further comprises the step of biasing said first input stage transistors in saturation.

* * * * *